United States Patent [19]
Segami

[11] Patent Number: 6,097,248
[45] Date of Patent: Aug. 1, 2000

[54] SWITCHED CAPACITOR AMPLIFIER WITH ONE-CLOCK DELAY

[75] Inventor: Masahiro Segami, Tokyo, Japan

[73] Assignee: Yokogawa Electric Corporation, Tokyo, Japan

[21] Appl. No.: 09/275,675

[22] Filed: Mar. 24, 1999

[30] Foreign Application Priority Data

Apr. 10, 1998 [JP] Japan .................................. 10-099323

[51] Int. Cl.[7] ........................................................ H03F 1/02
[52] U.S. Cl. .............................. 330/9; 330/51; 327/124; 327/337
[58] Field of Search .................................. 330/9, 51, 107; 327/124, 307, 337, 554

[56] References Cited

U.S. PATENT DOCUMENTS

| | | | |
|---|---|---|---|
| 4,849,707 | 7/1989 | Nicollini | ........................................ 330/9 |
| 4,862,121 | 8/1989 | Hochschild et al. | ...................... 333/173 |
| 5,220,286 | 6/1993 | Nadeem | ........................................ 330/9 |

*Primary Examiner*—Robert Pascal
*Assistant Examiner*—Henry Choe
*Attorney, Agent, or Firm*—Moonray Kojima

[57] ABSTRACT

A switched capacitor amplifier useful in integrated circuits and capable of low power operation, wherein the amplifier comprises at least one first hold capacitor, at least one second hold capacitor, a transconductance amplifier, first switching circuit for either (a) allowing the first hold capacitor to retain an input voltage, or (b) outputting retained input voltage through the transconductance amplifier, and a second switching circuit for either (a) feeding a voltage obtained by reversing the polarity of voltage retained by the second hold capacitor back to the transconductance amplifier for outputting as output voltage, or (b) allowing voltage retained by the first hold capacitor to be held by the second hold capacitor.

25 Claims, 15 Drawing Sheets

FIG. 3
PRIOR ART
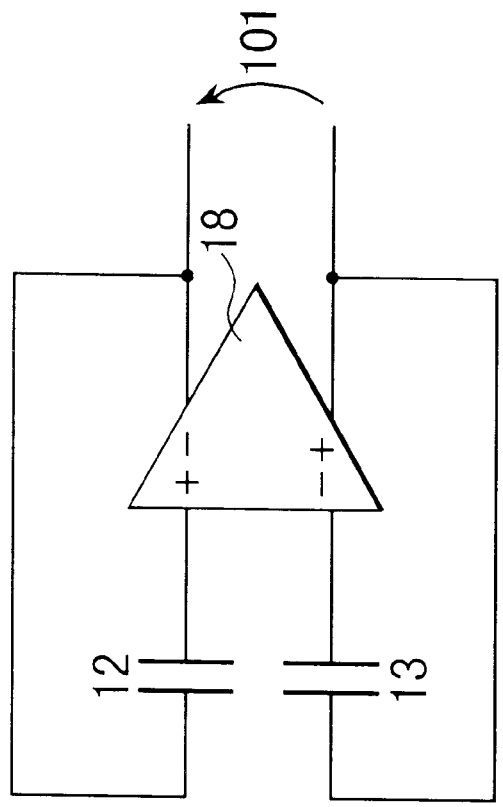
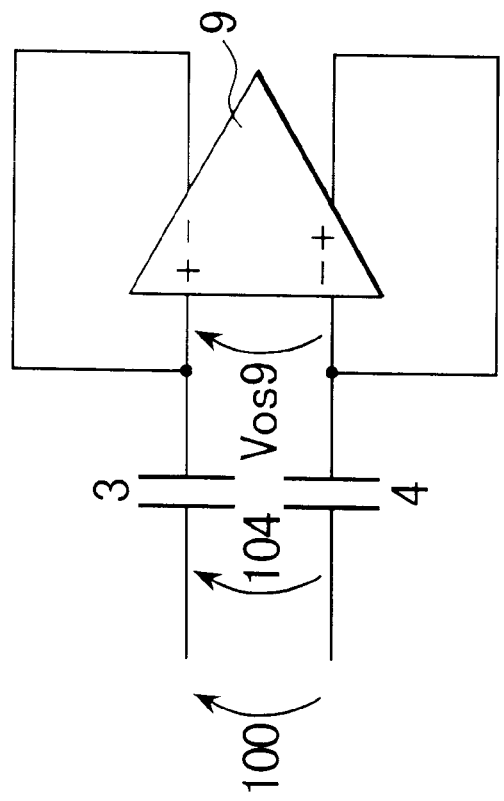

SWITCHED CAPACITOR AMPLIFIER WITH ONE-CLOCK DELAY

BACKGROUND OF THE INVENTION

1. Field of Invention

This invention relates to a switched capacitor amplifier which is useful in an integrated circuit and capable of operation with reduced power.

2. Description of the Prior Art

FIG. 1 shows a conventional switched capacitor amplifier comprising analog switches 1,2,5,6,7,8,10,11,14,15,16 and 17 (which are represented in the drawing by symbol MOS (metal oxide semiconductor) transistors); capacitors 3,4,12 and 13; transconductance amplifiers 9, 18 (hereinafter often referred to as "amplifiers"); differential input voltage 100 (it is to be understood that reference to voltage and other signals includes the sources of such voltage and other signals); differential output voltage 101; control signals 102,103 for controlling the analog switches; and voltages 104,105 and 106 at the respective points in the figure. The foregoing amplifier is also shown as comprising a half-delay circuit 200a comprising components 1 to 9 and a half-delay circuit 200b comprising components 10 to 18.

Differential input voltage 100 is applied to one end of each of analog switches 1 and 2. The other end of analog switch 1 is connected to one end of each of capacitor 3 and analog switch 5. The other end of analog switch 2 is connected to one end of each of capacitor 4 and analog switch 8. The other end of capacitor 3 is connected to the non-inverting input terminal of amplifier 9 and to one end of analog switch 6. The other end of capacitor 4 is connected to the inverting input terminal of amplifier 9 and to one end of analog switch 7. In addition, the inverting output terminal of amplifier 9 is connected to the other end of each of analog switches 5 and 6 and to one end of analaog switch 10. The non-inverting output terminal of amplifier 9 is connected to the other end of each of analog switches 7 and 8 and to one end of analog switch 11.

Similarly, the other end of analog switch 10 is connected to one end of each of capacitor 12 and analog switch 14. The other end of analog switch 11 is connected to one end of each of capacitor 13 and analog switch 17. The other end of capacitor 12 is connected to the non-inverting input terminal of amplifier 18 and to one end of analog switch 15. The other end of capacitor 13 is connected to the inverting input terminal of amplifier 18 and to one end of analog switch 16. In addition, the inverting output terminal of amplifier 18 is connected to the other end of each of analog switches 14 and 15. The non-inverting output terminal of amplifier 18 is connected to the other end of each of analog switches 16 and 17. The non-inverting and inverting output terminals of amplifier 18 provide a differential output voltage 101.

A control signal 102 is applied to the control input terminal of each of analog switches 1,2,6,7,14 and 17. A control signal is applied to the control input terminal of each of analog switches 5,8,10,11,15 and 16.

The operation of the conventional amplifier of FIG. 1 is described with reference to FIGS. 2(*a*)–2(*g*), 3 and 4, wherein FIGS. 2(*a*)–2(*g*) are timing diagrams showing how the amplifier operates in terms of timing; and FIGS. 3 and 4 show the connection relationship of the circuit components of FIG. 1 during each timing phase.

As shown in FIGS. 2(*a*)–2(*b*), control signals 102 and 103 are clock signals having phases which are opposite to each other. During the phase P001, the control signal 102 is at a high level and control signal 103 is at a low level. Hence, analog switches 1,2,6, 7, 14 and 17 are turned ON, and analog switches 5,8,10,11,15, and 16 are turned OFF.

FIG. 3 shows the connection relationship between amplifiers 9 and 18 and capacitors 3,4,12 and 13 during phase P001 in FIG. 2. That is voltage 104 equals differential input voltage 100 since voltage 100 is applied to one end of each of capacitors 3 and 4.

Amplifier 9 functions as a voltage follower since the inverting output terminal thereof is feedback, i.e. connected, to the non-inverting input terminal thereof, and the non-inverting output terminal thereof is fed back, i.e. connected, to the inverting input terminal thereof. Thus, the input terminals of amplifier 9 serve as artificial ground and an offset voltage Vos9 developes across the input terminals, as shown in FIG. 1.

Accordingly, assuming that the differential voltage 100 is Vin and the voltage 104 is V104, then differential voltage Vc1 retained by capacitors 3 and 4 is:

$$Vc1 = V104 - Vos9 \quad (1)$$
$$= Vin - Vos9$$

During Phase P002, however, control signal 102 is at a low level and control signal 103 is at a high level (see FIGS. 2(*a*) and 2(*b*)). Thus, analog switches 1,2,6,7,14 and 17 are turned OFF, and analog switches 5,8,10,11, 15 and 16 are turned ON.

FIG. 4 shows the connection relationship between amplifiers 9 and 18 and capacitors 3,4,12 and 13 during phase P002 of FIG. 2. In other words, a feedback loop is formed via capacitors 3 and 4, in amplifier 9. If the input bias current of amplifier 9 is zero, electric charge injected into capacitors 3 and 4 is not discharged. Hence, capacitors 3 and 4 retain the final value of differential input voltage 100 when control signal 102 changes to a low level state and the control signal 103 changes to a high level state (see FIGS. 2(*a*), 2(*b*) and 2(*c*)).

Assuming the final value of teh differential input voltage 100 is Vk, the differential voltage Vc2 retained by capacitors 3 and 4 is:

$$Vc2 = Vk - Vos9 \quad (2)$$

If we assume voltage 105, which is the output voltage of the amplifier 9, equals V105, then V105 is calculated as follows:

$$V105 = Vc2 + Vos9 \quad (3)$$
$$= Vk - Vos9 + Vos9$$
$$= Vk$$

In other words, voltage V105, which is the output voltage of amplifier 9, does not contain the offset voltage Vos9. This means that the offset voltage component of the output voltage provided by half-delay circuit 200a, is corrected.

Similarly, voltage 105 is applied as a differential input signal to half-delay circuit 200b sharing the same structure with half-delay circuit 200a. Since the half-delay circuit 200b operates with the inverse phase of the half-delay circuit 200a, the final value Vk of the differential output voltage 101 is outputted during phase P003 (see FIGS. 2(*a*)–2(*g*)). This means that the final voltage level VK retained during phase P001 is outputted with a delay of one clock each for control signals 102 and 103 (see FIGS. 2(*a*)–2(*g*)).

As a result, it is possible to correct the offset voltage component of the retained differential input voltage 100 and output the voltage with a delay of one clock, by connecting half-delay circuits 200a and 200b in series and driving the circuits with the phases of the control signlas reversed with respect to each other.

However, in the conventional switched capacitor amplifier of FIG. 1, it is either amplifier 9 or amplifier 18 alone that actually processes the differential input voltage 100. In other words, in the condition shown in FIG. 3, the amplifier 18 retains or amplifies voltage 100, whereas in the condition shown in FIG. 4, amplifier 9 retains or amplifies voltage 100. In either condition, the other amplifier runs through a precharging cycle to correct any offset voltage.

Accordingly, only one half of the entire circuit and consumed power is used effectively to correct the offset voltage. Thus, the remaining half of the circuit and power are wasted. This problem becomes more serious when the amplifier is operated at higher speeds.

SUMMARY OF THE INVENTION

Accordingly, an object of the invention is to overcome the aforementioned and other deficiencies and disadvantages of the prior art.

Another object is to provide a switched capacitor amplifier which is useful in integrated circuits and consumes less power.

BRIEF DESCRIPTION OF THE DRAWINGS

FIG. 3 is a diagram depicting the connection relationship of the circuit components of FIG. 1 during each timing phase.

DETAILED DESCRIPTION OF THE PREFERRED EMBODIMENTS

Figure 1:
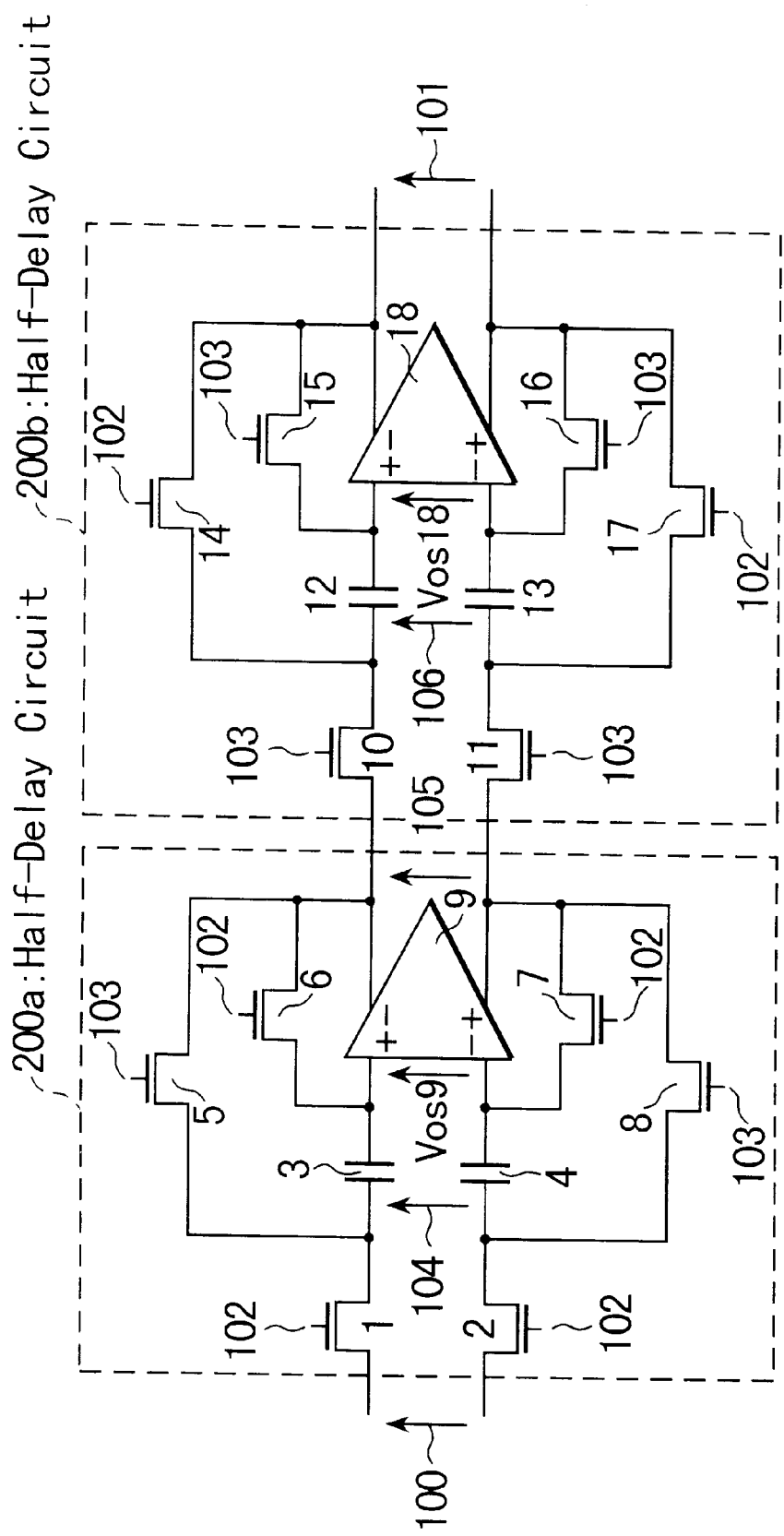
FIG. 1 is a circuit diagram depicting a conventional switched capacitor amplifier.
Figure 2:
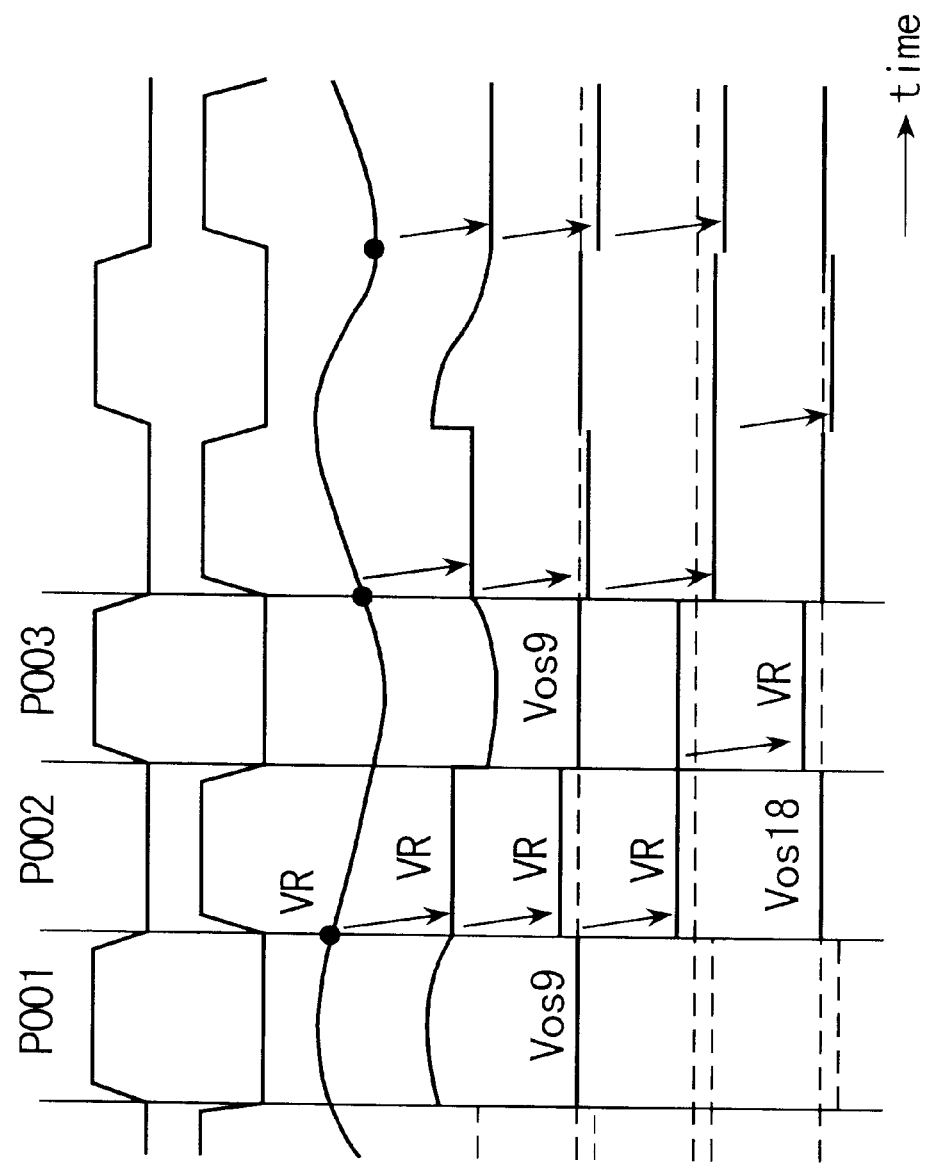
FIGS. 2(a)–2(g) are timing diagrams depicting operation of the circuit of FIG. 1.
Figure 4:
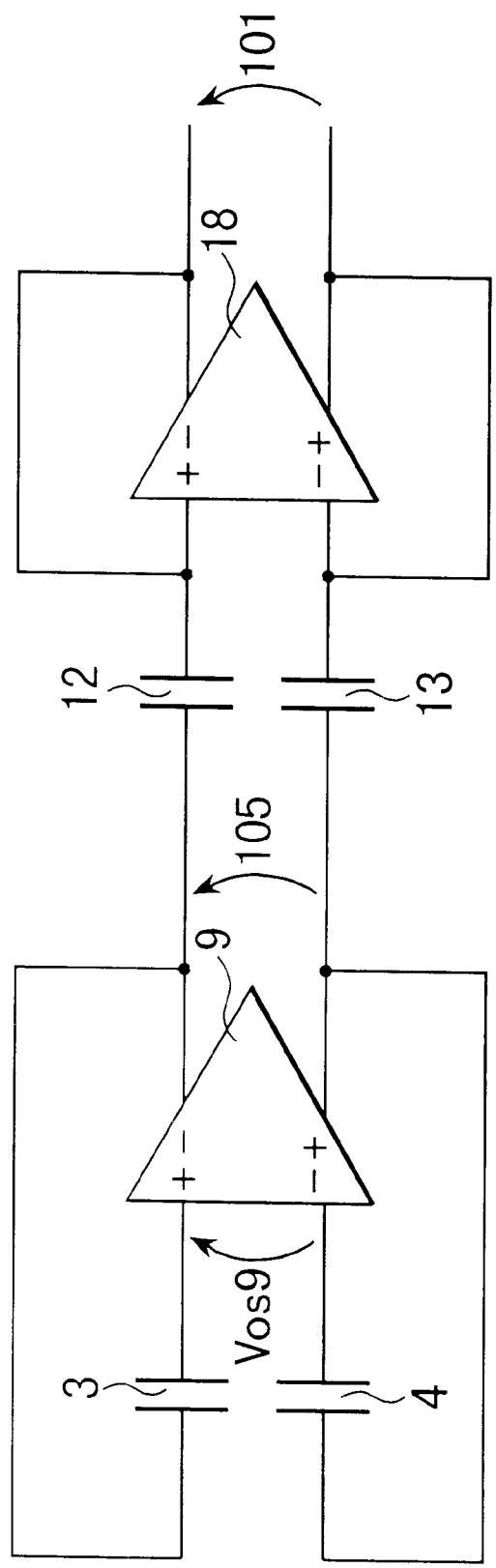
FIG. 4 is another diagram depicting the connection relationship of circuit components of FIG. 1 during each timing phase.
Figure 5:
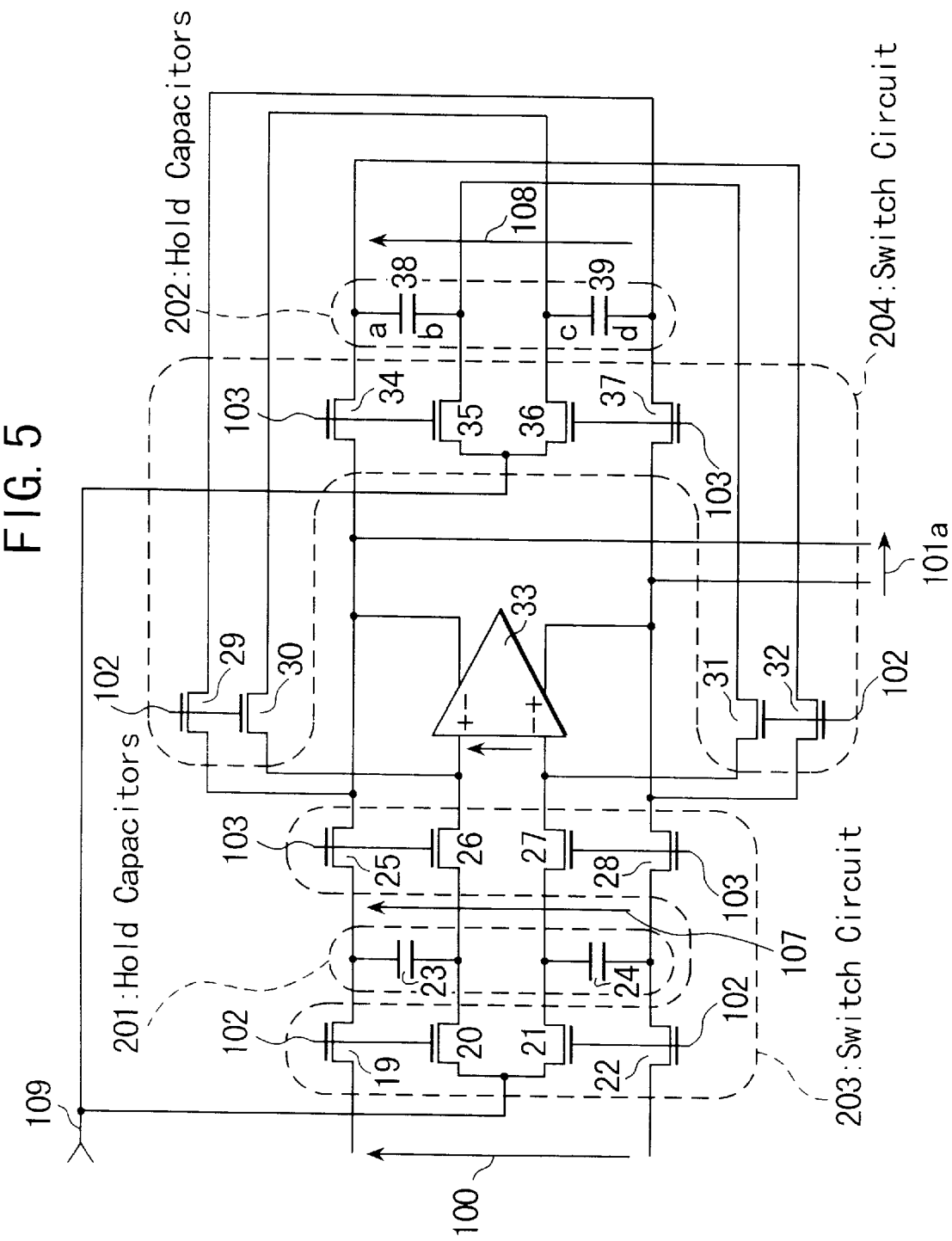
FIG. 5 is a circuit diagram depicting a first illustrative embodiment of the invention.

In FIG. 5, the components bearing reference numbers 100, 102 and 103 are the same as in FIG. 1. The first illustrative embodiment further comprises analog switches 19,20,21,22, 25,26,27,28,29,30,31, 32, 34, 35,36 and 37; capacitors 23,24,38 and 39; amplifier 33; differential output voltage 101 a; voltages 107 and 108 at their respective circuit points; and common mode reference voltage 109. It is to be understood that reference to a voltage or signal also includes the source of such voltage or signal, and such reference to the voltage or signal being for sake of convenience of description and simplification of the drawing. Capacitors 23 and 24 comprise hold capacitors 201. Capacitors 38 and 39 comprise hold capacitors 202. Analog switches 19 to 22 and 25 to 28 comprise switch circuit 203. Analog switches 29 to 32 and 34 to 37 comprise a switch circuit 204.

Differential input voltage 100 is connected or applied to one end of each of analog switches 19 and 22. The other end of analog switch 19 is connected to one end of each of capacitor 23 and analog switch 25. The other end of analog switch 22 is connected to one end of each of capacitor 24 and analog switch 28. In addition, common mode reference voltage 109 is connected or applied to one end of each of analog switches 20,21,35, and 36. The other end of capacitor 23 is connected to the other end of analog switch 20 and to one end of analog switch 26. The other end of capacitor 24 is connected to the other end of analog switch 21 and to one end of analog switch 27.

The other end of analog switch 25 is connected to one end of each of analog switches 29 and 34 and to the inverting output terminal of amplifier 33. The other end of analog switch 26 is connected to one end of analog switch 30 and to the non-inverting input terminal of amplifier 33. The other end of analog switch 28 is connected to one end of each of analog switches 32 and 37 and to the non-inverting output terminal of amplifier 33. The other end of analog switch 27 is connected to one end of analog switch 31 and to the inverting input terminal of amplifier 33. The other end of capacitor 29 is connected to the other end of analog switch 37 and to one end of capacitor 39. The other end of analog switch 30 is connected to the other end of analog switch 36 and the other end of capacitor 39. The other end of analog switch 32 is connected to the oher end of analog switch 34 and to one end of capacitor 38. The other end of analog switch 31 is connected to the other end of analog switch 35 and the other end of capacitor 38.

In addition, control signal 102 is connected or applied to control input terminal of each of analog switches 19,20,21, 22, 29, 30, 31 and 32. A control signal 103 is connected or applied to the control input terminal of each of analog switches 25,26,27,28,34,35, 36, and 37. The non-inverting output terminal and the inverting output terminal of amplifier 33 provide differential output voltage 101a.

Figure 6:
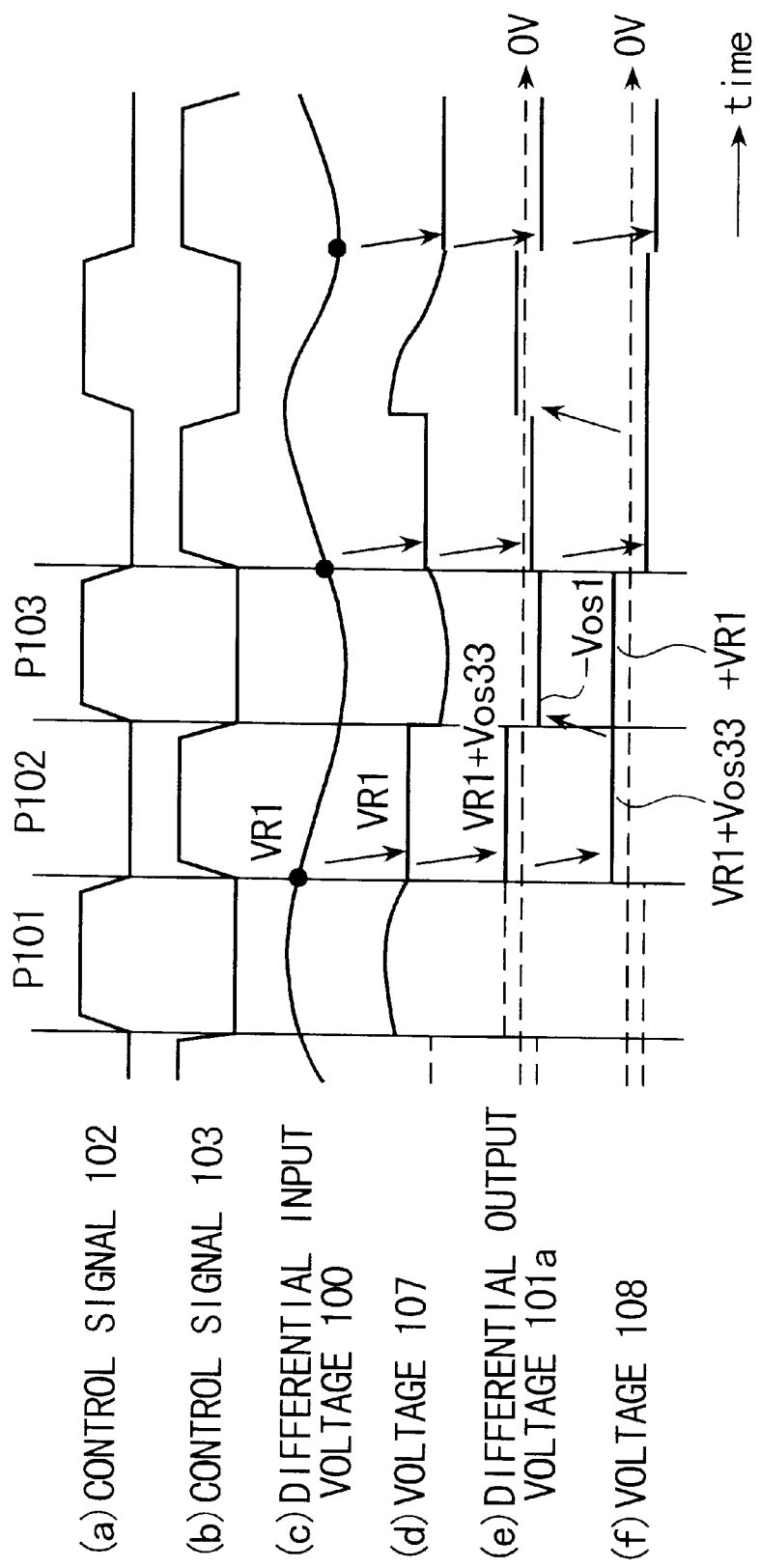
FIGS. 6(a)–6(f) are timing diagrams depicting operation of the embodiment of FIG. 5.
Figure 7:
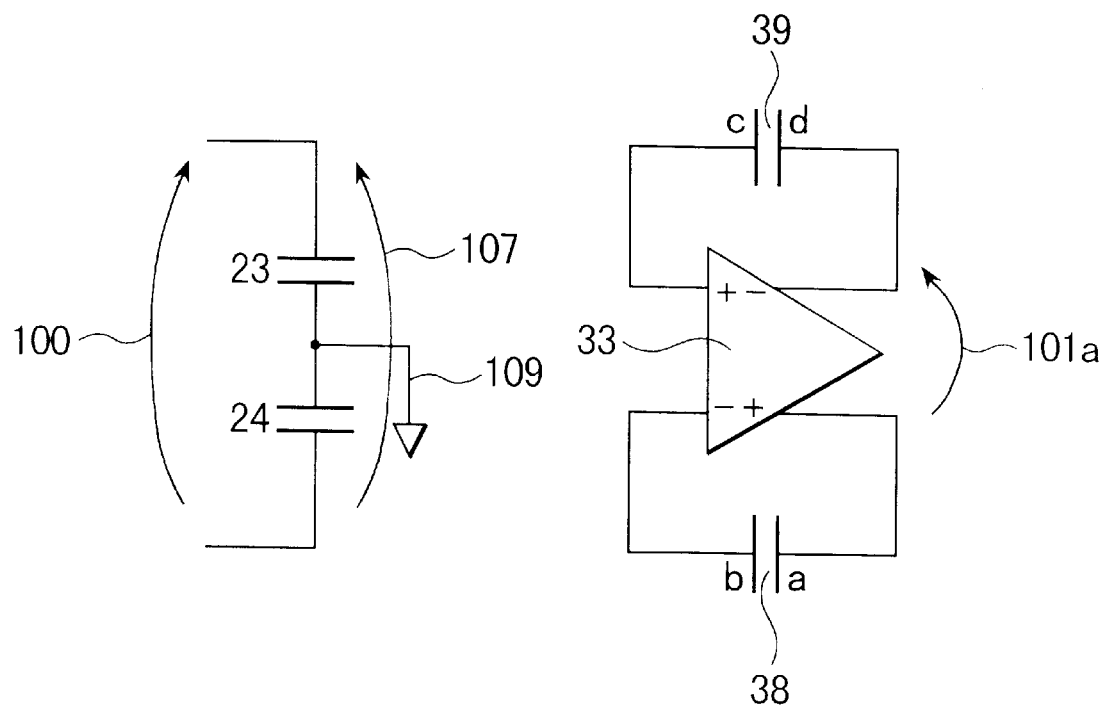
FIG. 7 is a diagram depicting the connection relationship of circuit components of FIG. 5 during each timing phase.
Figure 8:
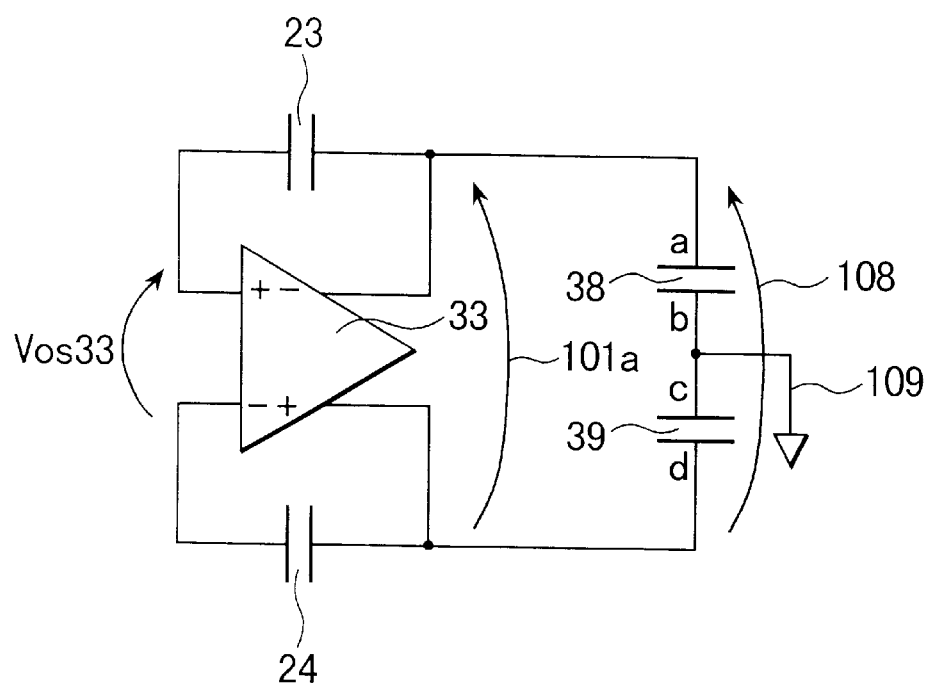
FIG. 8 is another diagram depicting the connection relationship of circuit components of FIG. 5 during each timing phase.

The operation of the embodiment of FIG. 5 will now be described with reference to FIGS. 6(a)–6(f), 7 and 8; wherein FIGS. 6(a)–6(f) are timing diagrams showing operation of the embodiment; and FIGS. 7 and 8 show connection relationships between the circuit components of the embodiment of FIG. 5 during the timing phases.

As shown in FIGS. 6(a) and 6(b), control signals 102 and 103 are clock signals having phases which are reverse of each other. During phase P101, control signal 102 is at a high level, and control signal 103 is at a low level. Thus, in phase P101, analog switches 19,20,21,22,29,30,31 and 32, are turned ON, and analog switches 25, 26,27,28,34,35,36 and 37 are turned OFF. In other words, all of the analog switches are classified into two groups: (1) a group that is driven by control signal 102, and (2) a group that is driven by control signal 103.

During phase P101, the connection relationship between amplifiers 33 and capacitors 23,24,38 and 39, is as shown in FIG. 7. That is, differential input voltage 100 is applied to one end of each of capacitors 23 and 24, and common mode reference voltage 109 is applied to the other end of each of capacitors 23 and 24, thereby equalizing voltage 107 that developes across hold capacitors 201 (see FIG. 5) to the differential input voltage 100.

During phase P102, however, control signal is at a low level and control sigal 103 is at a high level. Hence, in this phase analog switches 19, 20, 21, 22, 29,30, 31 and 32 are turned OFF and analog switches 25, 26, 27, 28, 34, 35, 36 and 37 are turned ON. The connection relationship durng phase P102 between amplifier 33 and capacitors 23, 24, 38 and 39, is as shown in FIG. 8. In summary, a feedback loop is formed via capacitors 23 and 24 in amplifier 33 by means of switch circuit 203 (see FIG. 5). If the input bias current of amplifier 33 is zero, the electric charge injected into capacitors 23 and 24, i.e. the hold capacitors 201, is not discharged. Hence, capacitors 23 and 24 retain the final values of the differential input voltage 100 when control signal 102 changes to a low level state and control signal 103 changes to a high level state.

Amplifier 33 is isolated by means of switch circuit 203 when capacitors 23 and 24 are charged. Hence, assuming the final value of the differential input voltage 100 is Vk1, then, the differential voltage Vc3 retained by capacitors 23 and 24 is:

$$Vc3 = Vk1 \qquad (4)$$

Then, by assuming the offset voltage of amplifier 33 is Vos33 and differential output voltage 101a, which is the output voltage of amplifier 33, is Vouta, the value of the differential output voltage 101a can be developed as follows:

$$Vouta = Vc3 + Vos33 \qquad (5)$$
$$= Vk1 + Vos33$$

In other words, amplifier 33 outputs final voltage Vk1, superposed on the amplifier's offset voltage Vos33, as differential output voltage 101a. At the same time, voltage 101a is applied to one end of each of capacitors 38 and 39, which comprise hold capacitors 202 (see FIG. 5) and the common mode reference voltage 109 is applied to the other end of each of capacitors 38 and 39. Consequently, by assuming that voltage 108 which developes across hold capacitors 202 is V108, the voltage V108 will equal the voltage shown in equation (5), that is:

$$V108 = Vk1 + Vos33 \qquad (6)$$

Referring back to FIGS. 6(a)–6(f), if control signal 102 is at a high level and control signal 103 is at a low level during the phase P103, amplifier 33 reverts to the connection relationship shown in FIG. 7. Consequently, a feedback loop is formed via capacitors 38 and 39, in amplifier 33, by means of switch circuit 204. At this point, however, capacitors 38 and 39, comprising hold capacitors 202, are reconnected to amplifier 33 with the polarities of the amplifier terminals reversed from the previous polarities.

More specifically, during phase P102, a terminal "a" (see FIG. 5) which is one end of capacitor 38, is connected to the inverting output terminal of amplifier 33, and terminal "d" (see FIG. 5) which is one end of capacitor 39, is connected to the non-inverting output terminal of amplifier 33, as shown in FIG. 8.

During phase P103, however, terminal "d" is connected to the inverting output terminal of amplifier 33 and terminal "a" is connected to the non-inverting output terminal of amplifier 33, as shown in FIG. 7.

Consequently, if the input bias current of amplifier 33 is zero, the electric charge injected into capacitors 38 and 39 which comprise hold capacitors 202, is not discharged. The differential output voltage 101a during phase P103 is therefore represented by:

$$Vouta = -V108 + Vos33 \qquad (7)$$
$$= -(Vk1 + Vos33) + Vos33$$
$$= -Vk1$$

This means that during phase P101, a voltage which is reversed in polarity to the final voltage level Vk1 retained by hold capacitors 201, is outputted with a delay of one clock each for control signals 102 and 103. In addition, the offset voltage is corrected at this time. As a result, it is possible to correct the offset voltage component of a voltage obtained by reversing the polarity of the voltage retained by hold capacitors 201, and to output the voltage with a delay of one clock. This is achieved by allowing the voltage retained by hold capacitors 201, by means of switch circuit 203, to be held by hold capacitors 202, by means of switch circuits 203 and 204, and then feeding that voltage back to the amplifier 33 by means of switch circuit 204 with the polarity of the voltage reversed.

In other words, advantageously, with the invention, it is possible to correct the offset voltage component of a voltage obtained by reversing the polarity of the voltage retained by amplifier 33, and then to output the voltage with a delay of one clock. This makes it possible to reduce the size of the circuit and the amount of power consumed, both by a factor of almost one half.

Figure 9:
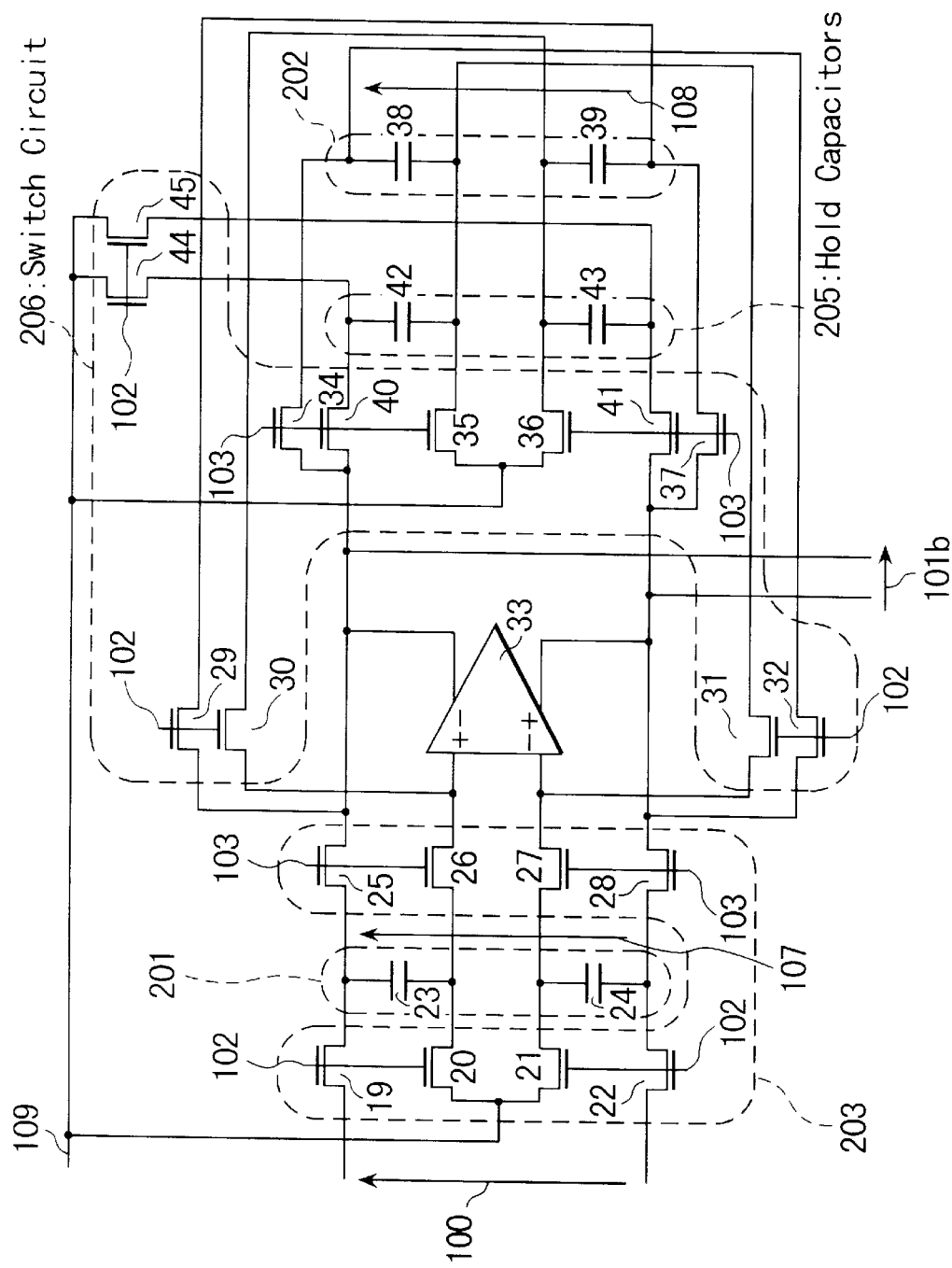
FIG. 9 is a circuit diagram depicting a second illustrative embodiment of the invention.

FIG. 9 shows components which are the same as those in FIG. 5. Also, the embodiment comprises analog switches 40, 41, 44 and 45; capacitors 42 and 43; and a differential output voltage 101b. Capacitors 42 and 43 comprise hold capacitors 205. Capacitors 29 to 37, 40, 41, 44 and 45 comprise switch circuit 206.

The differential input voltage 100 is connected or applied to one end of each of analog switches 19 and 22. The other end of analog switch 19 is connected to one end of each of capacitor 23 and analog switch 25. The other end of analog switch 22 is connected to one end of each of capacitor 24 and analog switch 28. In addition, common mode reference voltage 109 is connected or applied to one end of each of analog switches 20, 21, 35, 36, 44 and 45. The other end of capacitor 23 is connected to the other end of analog switch 20 and to one end of analog switch 26. The other end of capacitor 24 is connected to the other end of analog switch 21 and to one end of analog switch 27.

The other end of analog switch 25 is connected to one end of each of analog switches 29, 34 and 40 and to the inverting output terminal of amplifier 33. The other end of analog switch 26 is connected to one end of analog switch 30 and to the non-inverting input terminal of amplifier 33. The other end of analog switch 28 is connected to one end of each of analog switches 32, 37 and 41 and to the non-inverting output terminal of amplifier 33. The other end of analog switch 27 is connected to one end of analog switch 31 and to the inverting input terminal of amplifier 33.

The other end of analog switch 29 is connected to the other end of analog switch 37 and to one end of capacitor 39. The other end of analog switch 30 is connected to the other end of analog switch 36, the other end of capacitor 39 and one end of capacitor 43. The other end of capacitor 43 is connected to the other end of each of analog switches 41 and 45. The other end of capacitor 32 is connected to the other end of analog switch 34 and to one end of capacitor 38. The other end of analog switch 31 is connected to the other end of analog switch 35, the other end of capacitor 38 and one end of capacitor 42. The other end of capacitor 42 is connected to the other end of each of analog switches 40 and 44.

In addition, a control signal 102 is connected or applied to the control input terminal of each of analog switches 19, 20, 21, 22, 29, 30, 31, 32, 44, and 45. A control signal 103 is connected or applied to the control input terminal of each of analog switches 25, 26, 27, 28, 34, 35, 36, 37, 40 and 41. In addition, the non-inverting output terminal and inverting output terminal of amplifier 33 provide differential output voltage 101b.

Figure 10:
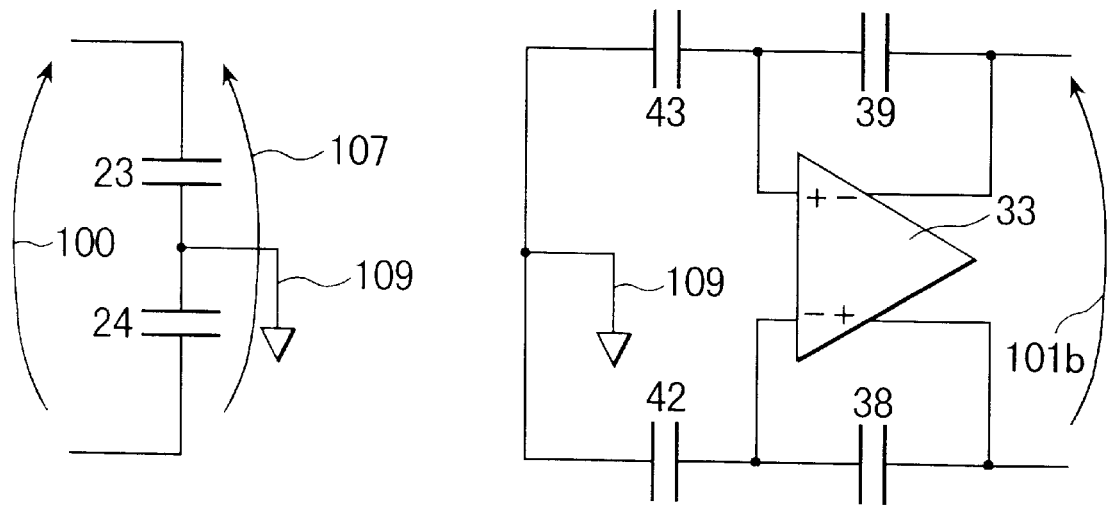
FIG. 10 is a diagram depicting the connection relationship of circuit diagrams of FIG. 9 during each timing phase.
Figure 11:
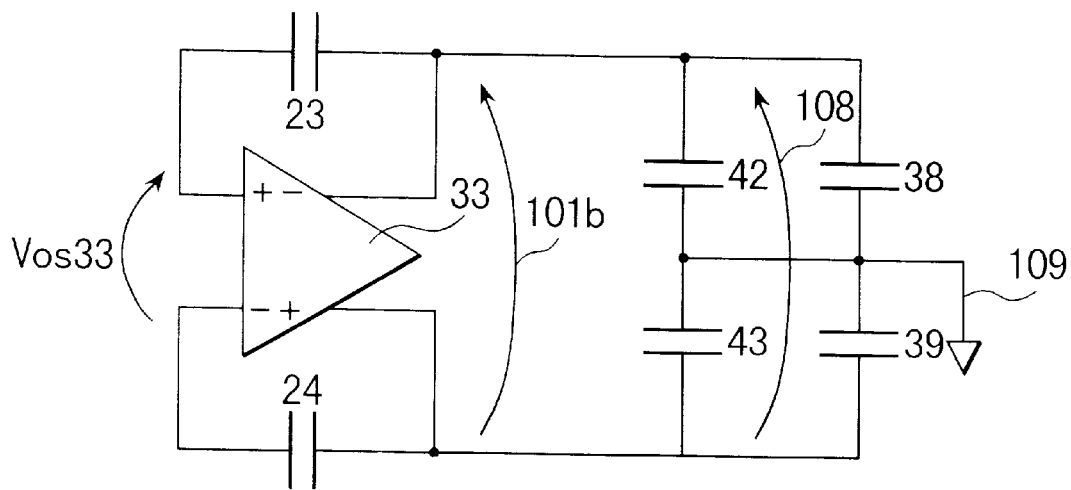
FIG. 11 is another diagram depicting the connection relationship of circuit components of FIG. 9 during each timing phase.

The operation of the embodiment of FIG. 9 will now be described with reference to FIGS. 10 and 11, wherein FIG. 10 and FIG. 11 show the connection relationship between the components of FIG. 9. during each timing phase. Any description that is the same as that given for FIG. 5 will not be repeated hereat for sake of brevity.

If control signal 102 is at a high level and control signal 103 is at a low level, analog switches 19, 20, 21, 22, 29, 30, 31, 32, 44, and 45 are turned ON, and analog switches 25, 26, 27, 28, 34, 35, 36, 37, 40 and 41 are turned OFF. In this timing phase, the connection relationship between amplifier 33 and capacitors 23, 24, 38, 39, 42 and 43 is as shown in FIG. 10. In addition, similar to the embodiment of FIG. 5, the differential input voltage 100 is applied to one end of each of capacitors 23 and 24 by means of switch circuit 203, and the common mode reference voltage 109 is applied to the other end of each of capacitors 23 and 24, thereby equalizing voltage 107, that developes across the hold capacitors 201, to the differential input voltage 100.

However, if control signal 102 is at a low level, and control signal 103 is at a high level, analog switches 19, 20, 21, 22, 29, 30, 31, 32, 44 and 45 are turned OFF, and analog switches 25, 26, 27, 28, 34, 35, 36, 37, 40 and 41 are turned ON. In this timing phase, the connection relationship between amplifier 33 and capacitors 23, 24, 38, 39, 42 and 43, is as shown in FIG. 11. In addition, similar to the embodiment of FIG. 5, amplifier 33 outputs final voltage Vk1, superposed on amplifier offset voltage Vos33, as differential output voltage 101b.

At the same time, voltage 101b is applied to one end of each of capacitors 38 and 39, which comprise hold capacitors 202, and to one end of each of capacitors 42 and 43, which comprise hold capacitors 205, by means of switch circuit 206. Common mode reference voltage 109 is applied to the other end of each of capacitors 38 and 39 and to the other end of each of capacitors 42 and 43. Consequently, assuming the voltage 108, that developes across both hold capacitors 202 and hold capacitors 205, is V108, then, the voltage V108 equals the voltage shown in Equation (5). When, control signals 102 and 103 change back to high and low levels respectively, the connection relationship reverts back to that shown in FIG. 10. At this point, however, common mode reference voltage 109 is applied to one end of each of capacitors 42 and 43. The other end of each of capacitors 42, and 43 serves as an artificial ground. As a result, charge transfer takes place in the direction from capacitors 42 and 43 to capacitors 38 and 39. This process is described with reference to FIGS. 12 and 13 which show voltages at respective components before and after charge transfer. For ease of description, common mode reference voltage 109 is assumed to be 0 volt. In addition, the capacitance of capacitors 38 and 39 is assumed to be C and the capacitance of capacitors 42 and 43 is assumed to be n·C.

Figure 12:
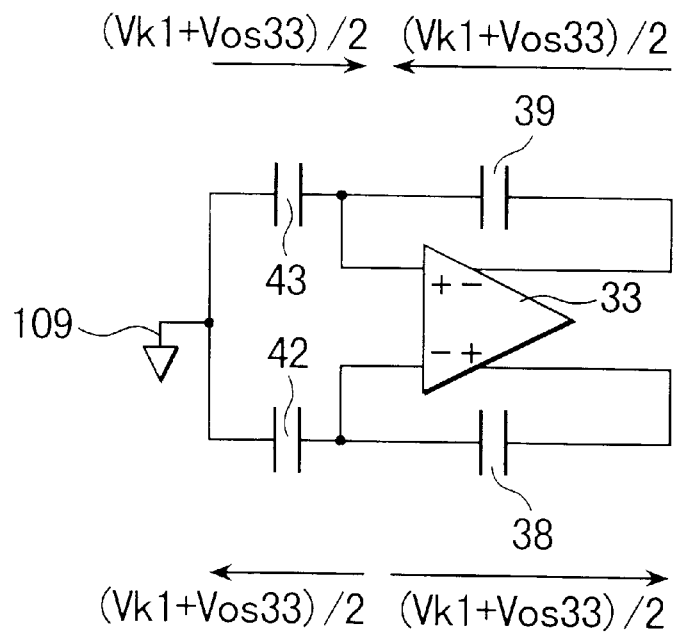
FIG. 12 is a schematic diagram depicting voltages at the respective circuit components of FIG. 9 before charge transfer.
Figure 13:
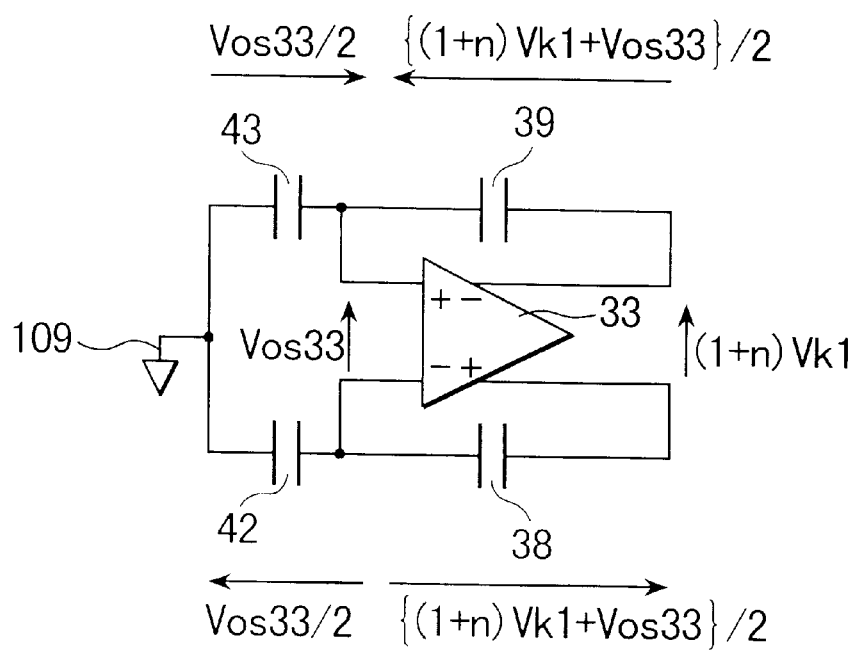
FIG. 13 is a schematic diagram depicting voltages at the respective circuit components of FIG. 9 after charge transfer.

In the state before charge transfer shown in FIG. 12, the voltage level Vk1+Vos33, shown in Equation 5, is retained by capacitors 38 and 39 and by capacitors 42 and 43, as shown in FIG. 11. In this case, since common mode reference voltage 109 is assumed to be 0 volt, each of capacitors 38, 39, 42 and 43, retains the voltage level (Vk1+Vos33)/2. In this state, if the connection relationship is as shown in FIG. 13, the voltage level at one end of each of capacitors 42 and 43 becomes 0 volt and offset voltage Vos 33 of amplifier 33 is applied to the other end of capacitors 42 and 43. As a result, electric charge is released from each of capacitors 42 and 43 and the voltage level retained by capacitors 42 and 43 changes to Vos33/2. This means that if we assume that the electric charge transferred from each of capacitors 42 and 43 is Q, then the following equation holds true:

$$Q = n \cdot C \cdot [(Vk1 + Vos33)2 - Vos33/2] \qquad (8)$$
$$= n \cdot C \cdot Vk1/2$$

Since this charge is injected into each of capacitors 38 and 39, then, the following equation also holds true given that the voltages that develope across the capacitors 38 and 39 are V38 and V39, respectively.

$$V38 = -V39 \qquad (9)$$
$$= (Vk1 + Vos33)/2 + Q/c$$
$$= (Vk1 + Vos33)/2 + n \cdot Vk1/2$$
$$= [(1+n) \cdot Vk1 + Vos33]/2$$

Hence, assuming the different output voltage 101b, which is the amplifier 33 output, is Voutb, then:

$$Voutb = V38 - V39 + Vos33 \quad (10)$$
$$= 2 \cdot [(1 + n) \cdot Vk1 + Vos33]/2 + Vos33$$
$$= -(1 + n) \cdot Vk1$$

From Equation (10), it is understood that a voltage, which is reverse in polarity to final voltage Vk1 retained by hold capacitors 201 and is (n+1) times higher than the voltage Vk1, is outputted with a delay of one clock each for control signals 102 and 103. In addition, the offset voltage component of the output voltage is corrected at this time.

As a result, it is possible to correct the offset voltage component of the voltage obtained by reversing the polarity of the voltage retained by hold capacitors 201 and amplifying same; and to output the voltage with a delay of one clock, by allowing the voltage retained by the hold capacitors 201, by means of switch circuit 203, to be held by hold capacitors 302 and 205 by means of switch circuits 203 and 26; transferring the electric charge in hold capacitors 205 to hold capacitors 202; and then feeding the voltage retained by hold capacitors 202 back to amplifier 33 by means of switch crcuit 206, with the voltage polarity reversed. Hence, it can be appreciated that the invention provides many advantages which are not available in the prior art.

Figure 14:
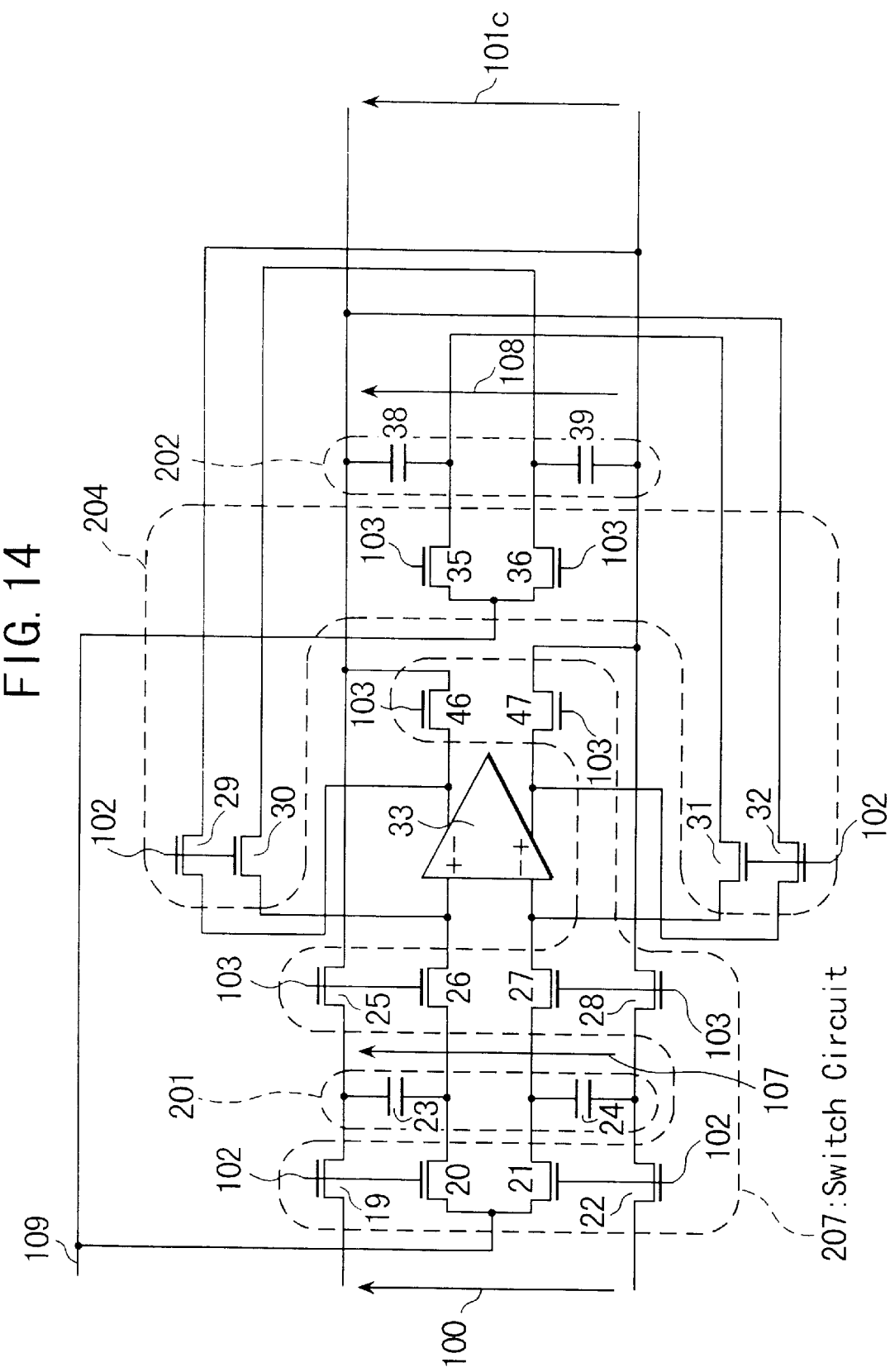
FIG. 14 is a circuit diagram depicting a third illustrative embodiment of the invention.

FIG. 14 shows a switched capacitor amplifier which can prevent the polarity of the voltage retained by the hold capacitors 201 from being reversed, and which comprises components having the reference numbers 19 to 33, 35, 36, 38, 39, 100, 102, 107, 108, 109, 201, 202, and 204 which are similar to those shown in FIG. 5; analog switches 46, and 47; and a differential output voltage 101c. Components 19 to 22, 25 to 28, 46 and 47 comprise switch circuit 207.

The connection relationship is similar to the one shown in FIG. 5, except that the inverting output terminal of amplifier 33 is connected to one end of each of analog switches 29 and 46. The non-inverting output terminal of amplifier 33 is connected to one end of each of analog switches 32 and 47. The other end of each of analog switches 46 and 47 is connected to the other end of each of analog switches 25 and 28.

The operation of the embodiment of FIG. 14 is now described with reference to FIGS. 15 and 16 which show the connection relationship between the components of FIG. 14 during each timing phase. Operational details for functions and components already explained with reference to the embodiment of FIG. 5 will not be repeated hereat for sake of simplicity and clarity.

Figure 15:
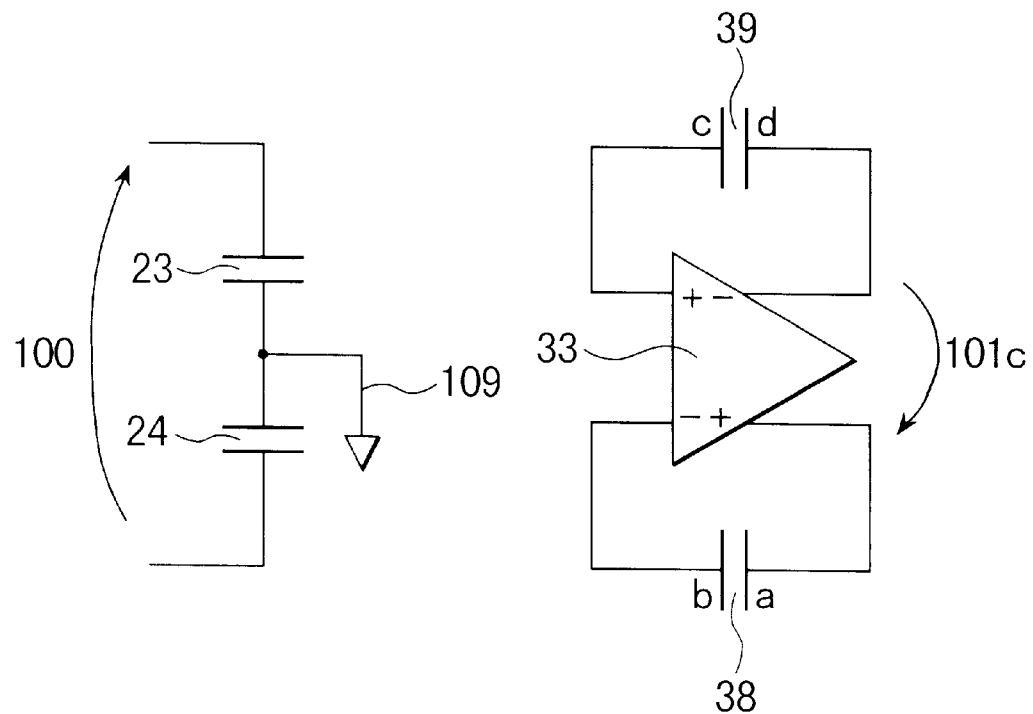
FIG. 15 is a diagram depicting the connection relationship of the circuit components of FIG. 14 during each timing phase.
Figure 16:
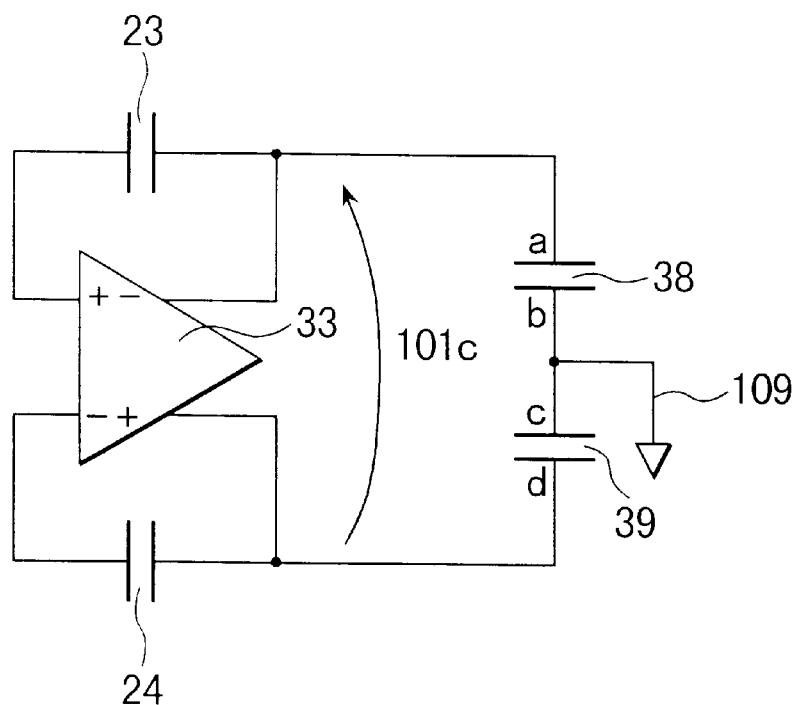
FIG. 16 is another diagram depicting the connection relationship of the circuit componet of FIG. 14 during each timing phase.

The circuit diagrams shown in FIGS. 15 and 16 are virtually the same as those shown in FIGS. 7 and 8. However, since the embodiment of FIG. 14 is configured so that during the timing phase shown in FIG. 15, the voltage across one end of each of capacitors 38 and 39, which are both ends of hold capacitors 202, serves as the differential output voltage 101c, a voltage having the same polarity as the final voltage Vk1 is outputted across the hold capacitors 201 with a delay of one clock each for the control signals 102 and 103. In addition, the offset voltage component of the output voltage is corrected during this time.

As a result, advantageously with the invention, it is possible to correct the offset voltage component of the voltage obtained by keeping the voltage retained by hold capacitors 201 at the same polarity; and to output the voltage with a delay of one clock, by allowing the voltage retained by the hold capacitors 201, by means of the switch circuit 207, to be held by hold capacitors 202, by means of switch circuits 204 and 207, and feeding voltage retained by hold capacitors 202 back to amplifier 33 by means of switch circuit 204, with the polarity fo the voltage being reversed, and then setting the voltage that developes across hold capacitors 202 as a differential output voltage.

Figure 17:
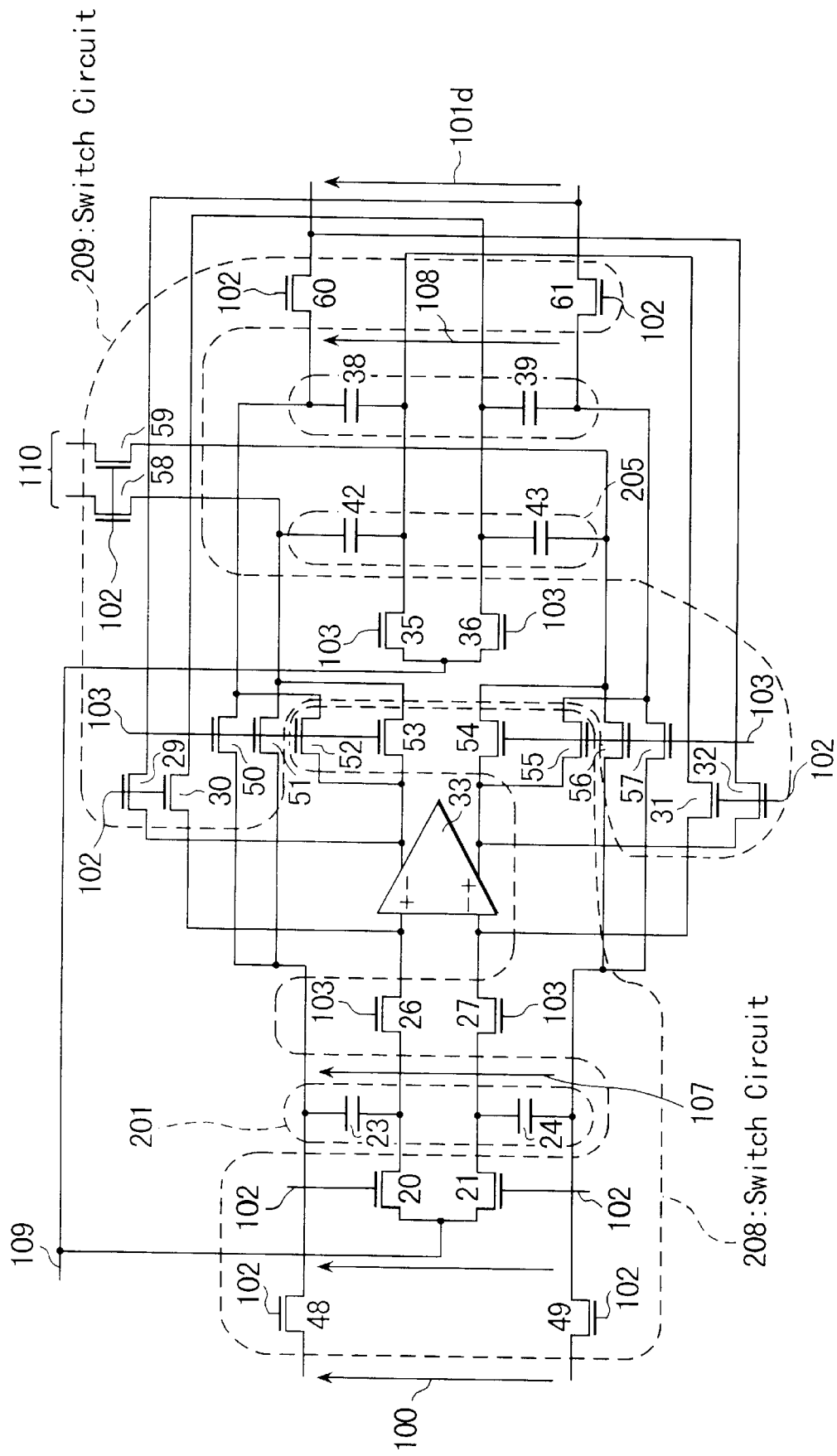
FIG. 17 is a diagram depicting a fourth illustrative embodiment of the invention.

FIG. 17 shows a switched capacitor amplifier which can amplify the voltage retained by hold capacitors 201 and prevent the polarity of the voltage from being reversed. In FIG. 17, the components having reference numbers 20 to 24, 26, 27, 29 to 33, 35, 36, 38, 39, 100, 102, 103, 107, 108, 109, 201 and 202, are similar to those in FIG. 5; and the components having the reference numbers 42, 43 and 205 are similar to those in FIG. 9. Also, shown are analog switches 46 to 61; differential output voltage 101d; and an external input voltage 110, such as an output from a D/A converter. Components 20,21,26,27,48, 49, 52, 53, 54 and 55 comprise switch circuit 208 and components 29 to 32, 50, 51, and 56 to 61 comprise switch circuit 209.

The differential input voltage 100 is connected or applied to one end of each of analog switches 48 and 49. The other end of analog switch 48 is connected to one end of capacitor 23 and to one end of each of analog switches 50 and 51. The other end of analog switch 49 is connected to one end of capacior 24 and to one end of each of analog switches 56 and 57. In addition, common mode reference voltage 109 is connected or applied to one end of each of analog switches 20,21,35 and 36. The other end of capacitor 23 is connected to the other end of analog switch 20 and to one end of analog switch 26. The other end of capacitor 24 is connected to the other end of analog switch 21 and to one end of analog switch 27. The other end of analog switch 26 is connected to one end of each of analog switch 30 and the non-inverting input terminal of amplifier 33. The other end of analog switch 27 is connected to one end of analog switch 31 and the inverting input terminal of amplifier 33.

The inverting input output terminal of amplifier 33 is connected to one end of each of analog switches 29, 52 and 53, and the non-inverting output terminal of amplifier 33 is connected to one end of each of analog switches 32, 54 and 55. The other end of analog switch 29 is connected to one end of analog switch 61. The other end of analog switch 30 is connected to one end of analog switch 36 and to one end of each of capacitors 39 and 43. The other end of capacitor 43 is connected to the other end of each of analog switches 54 and 56 and to one end of analog switch 59. The other end of analog switch 32 is connected to one end of analog switch 60. The other end of analog switch 31 is connected to the other end of analog switch 35 and to one end of each of capacitors 38 and 42.

The other end of capacitor 42 is connected to the other end of each of analog switches 51 and 53 and to one end of analog switch 58. The other end of capacitor 38 is connected to the other end of each of analog switches 50, 52 and 60. The other end of capacitor 39 is connected to the other end of each of analog 55, 57 and 61. In addition, a control signal 102 is connected or applied to the control input terminal of each of analog switches 20,21, 29, 30, 31, 32, 48, 49, 58, 59, 60 and 61. A control signal 103 is connected or applied to control input terminal of each of analog switches 26,27, 35, 36 and 50 to 57. In addition, an external input voltage 110, such as an output from D/A converter, is connected or applied to the other end of each of analog switches 58 and 59. Analog switches 60 and 61 provide differential output voltage 101d across each of the ends.

Figure 18:
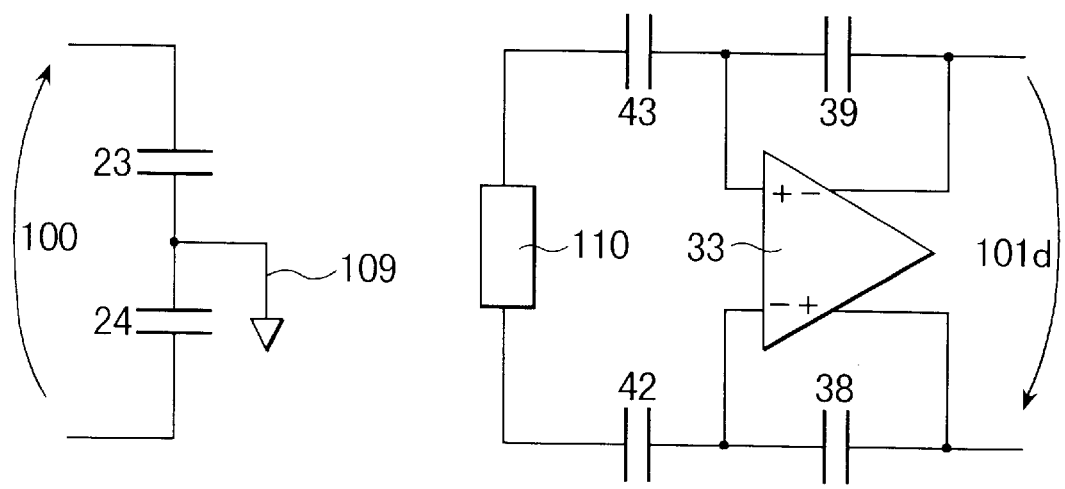
FIG. 18 is a diagram depicting the connection relationship of the circuit components of FIG. 17 during each timing phase.
Figure 19:
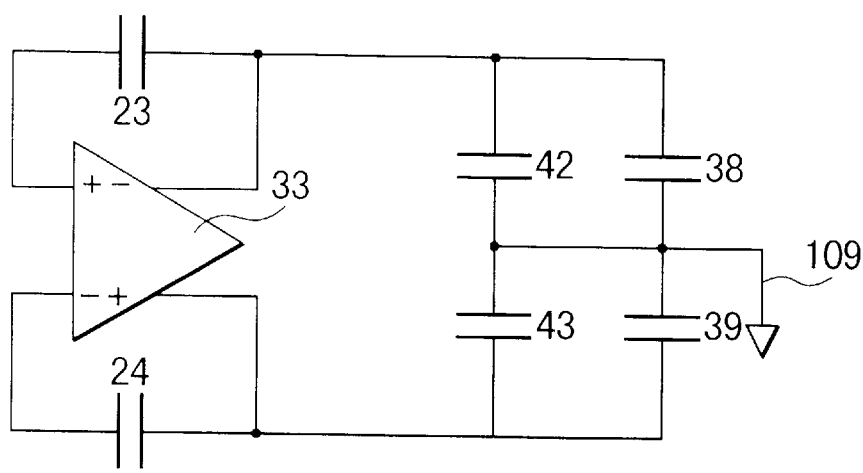
FIG. 19 is another diagram depicting the connection relationship of the circuit components of FIG. 17 during each timing phase.

The operation of the embodiment of FIG. 17 will now be described with reference to FIGS. 18 and 19, which show the connection relationship between the circuit components of FIG. 17 during each timing phase. Any description of the components which is the same as for the embodiment of FIG. 5 is not repeated hereat for sake of convenience. The connection relationship among the components shown in FIGS. 18 and 18 is the same as for that shown in FIGS. 10 and 11, except that the external input voltage 110, such as an output from a D/A converter, rather than the common mode reference voltage 109, is connected or applied to one end of each of capacitors 42 and 43. Another difference is that the embodiment of FIG. 17 is configured so that during the timing phase in FIG. 18, the switched capacitor amplifier of the invention outputs the voltage that is developed across hold capacitors 202, through analog switches 60 and 61, as differential output voltage 101d.

For example, assuming external input voltage 110, such as an output from a D/A converter, is 0 volt, and, as discussed hereinbefore, the capacitance of capacitors 38 and 39 is C and the capacitance of capacitors 42 and 43 is n·C (wherein "n" is an integer). Then, a voltage, which has the same polarity as the final voltage Vk1 retained by hold capacitors 201 during the timing phase in FIG. 18 and is (n+1) times higher than voltage Vk1, is outputted across hold capacitors 201 with a delay of one clock each for control signals 102 and 103. In addition, the offset voltage output component of the voltage is corrected at this time.

As a result, advantageously, with the invention, it is possible to correct the offset voltage component of the voltage obtained by keeping the voltage retained by hold capacitors 201 at the same polarity and amplifying the voltage; and to output the voltage with a delay of one clock, by allowing the voltage retained by hold capacitors 201 to be held by hold capacitors 202 and 205 by means of switch circuits 208 and 209, then transferring the electric charge in hold capacitors 205 to hold capacitors 202 and feeding the voltage retained by hold capacitors 202 back to the amplifier 33 by means of switch circuit 209 with the polarity of the voltage being reversed, and finally setting the voltage that developes across the hold capacitors 202 as the differential output voltage.

Furthermore, advantageously, with the invention it is possible to add an extra voltage level to the differential output voltage 101d by setting the external input voltage 110 appropriately.

Figure 20:
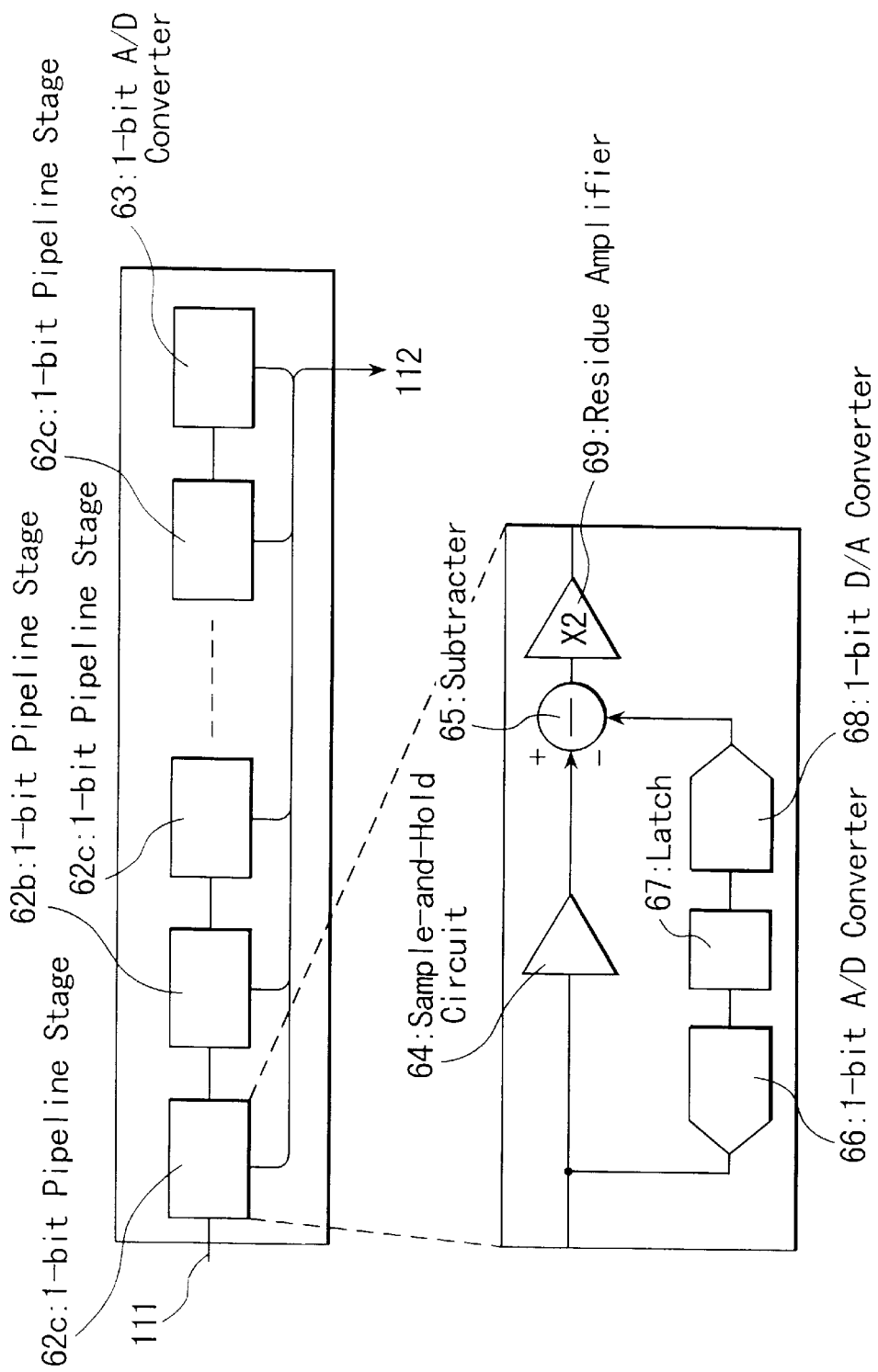
FIG. 20 is a block diagram depicting use of the invention in a high speed pipeline A/D (analog to digital) converter.

FIG. 20 shows application of the switched capacitor amplifier of FIG. 17 to a high speed pipeline A/D converter. In FIG. 20, there are provided one bit pipeline stage circuits (hereinafter referred to as "stage circuits") 62a, 62b, 62c, and 62d; a one bit A/D converter 63; a sample and hold circuit 64; a substractor 65; a one bit A/D converter 66; a latch 67; a one bit D/A converter 68; a residue amplifier 69; an analog input 111; and an A/D converted output signal 112.

An analog input signal 111 is applied to stage circuit 62a, whose analog output is connected or applied to stage circuit 62b. In addition, the analog output of stage circuit 62b is connected or applied to stage circuit 62c, whose analog output is connected or applied to stage circuit 62d. The analog output of stage circuit 62d is connected or applied to one bit A/D converter 63, while the digital outputs of stage circuits 62a, 62b, 62c, and 62d and the digital output of one bit A/D converter 63 are provided as the A/D converted output signal 112. Each stage circuit is configures so that the analog input signal 111 or the analog output of a preceding stage circuit is connected or applied to a sample and hold circuit 64 and a one bit A/D converter 66, and the analog output of the sample and hold circuit 64 is connected or applied to the adding input terminal of the subtractor 65, all as shown in FIG. 20.

The digital output of one bit A/D converter 66 is connected or applied throught latch 67 to one bit D/A converter 68, whose output is connected or applied to the substracting input terminal of subtractor 65. In addition, the output of subtractor 65 is connected or applied through residue amplifier 69, with a gain of two, to the subsequent stage circuit. By converting the analog input signal 111, using one bit A/D converter 66, to digital signals, one bit at a time, as discussed hereinabove, and doubling the difference, between the analog input signal and the analog signal which is obtained by re-converting each of the digital signals with the one bit D/A converter 68; and then outputting obtained analog signal to each subsequent stage in succession; advantageously, with the invention, it is possible to obtain digital signals having resolution as high as the number of stage circuits used in the application.

The switched capacitor amplifier of FIG. 17 may include the sample and hold circuit 64, the subtractor 65, and the residue amplifier 69 of FIG. 20. For example, in the connection relationship shown in FIG. 18, differential input voltage 100 is retained by hold capacitors 201. In the connection relationship of FIG. 19, voltage 100 retained by hold capacitors 201 is held by hold capacitors 202. In the next timing phase, the voltage retained by the hold capacitors 202, is outputted with its offset voltage component corrected. This means that the function of the sample and hold circuit 64 is achieved with optimal results.

Similarly, advantageously with the invention, it is possible to obtain a gain of two in the connection relationship shown in FIG. 18, for example, by setting capacitors 38,39, 42, and 43 in FIG. 17 to the same value of capacitance and thereby defining the parameter "n" as "n=1".

Furthermore, advantageously with the invention, since external input voltage 110, such as an output from a D/A converter, is appled to one end of each of capacitors 42 and 43, not only the electric charge in capacitors 42 and 43 is transferred to capacitors 38 and 39 but also an electric charge based on external input voltage 110 is added to the electric charge. Consequently, by appropriately setting external input voltage 110, it is possible to achieve and optimize the functions of subtractor 65 and residue amplifier 69. It should be noted that the application of the invention shown in FIG. 20 is only one example, and that a person skilled in the art can apply each of the embodiments of FIGS. 5, 9, 14 and 17 to various purposes.

The invention and the various embodiments thereof provide a number of features and advantages over the prior art, some of which are discussed hereinbelow.

For example, it is possible to correct the offset voltage component of the voltage obtained by reversing the polarity of the voltage retained by the first hold capacitors; and to output the voltage with a delay of one clock, by allowing the voltage retained by the first hold capacitors by means of the first switch circuit to be held by the second hold capacitors by means of the first and second switch circuits, and then feeding the voltage retained by the second hold capacitors back to the amplifier 33 by means of the second switch circuit, with the polarity of the voltage being reversed. In other words, advantageously, it is possible to correct the offset voltage component of the voltage obtained by reversing the polarity of a given retained voltage and to output the voltage with a delay of one clock, using only one amplifier.

Thus, advantageously, the invention can be easily applied to integrated circuits and the power consumption thereof reduced by about one half of previously attained power consumption values.

Moreover, advantageously, by setting the voltage retained by the second hold capacitors as a differential output voltage, it is possible to correct the offset voltage component of the voltage obtained by keeping the voltage retained by the first hold capacitors at the same polarity; and to output the voltage with a delay of one clock. It is also possible, advantageously, to deal with the differential signals by setting the input/output voltages as differential voltages.

Furthermore, advantageously, it is possible to correct the offset voltage component of the voltage obtained by reversing the polarity of the voltage retained by the first hold capacitors and amplifying the voltage; and to output the voltage with a delay of one clock, by allowing the voltage retained by the first hold capacitors by means fo the first switch circuit to be held by the second and third hold capacitors by means of the first and second switch circuits, and then transferring the electric charge in the third hold capacitors to the second hold capacitors and feeding the voltage retained by the second hold capacitors back to the amplifier 33 by means of the second switch circuit, with the polarity of the voltage being reversed.

Also, advantageously, it is possible to correct the offset voltage component of the voltage obtained by keeping the voltage retained by the first hold capacitors at the same polarity and amplifying the voltage; and to output the voltage with a delay of one clock, by allowing the voltage retained by the first hold capacitors by means of the first switch circuit, to be held by the second and third hold capacitors by means of the first and second switch circuits, and then transferring the electric charge in the third hold capacitors, to which an external input voltage is added, to the second hold capacitors, and feeding the voltage retained by the second hold capacitors back to the amplifier 33, by means of the second switch circuit, with the polarity of the voltage being reversed, and finally setting the voltage that developes across the second hold capacitors as a differential output voltage. It is also possible to add an extra voltage to the differential output voltage by appropriately setting the external input voltage. It is also possible to deal with differential signals by setting the input/output voltages as differential voltages.

Moreover, advantageously, the invention can be used in place of a sample and hold circuit, a subtractor, and a residue amplifier at each of a plurality of one bit pipeline stages that comprise a high speed pipeline A/D converter.

The foregoing description is illustrative of the principles of the invention. Numerous extensions and modifications thereof would be apparent to the person skilled in the art. It is to be understood that all such extensions and modifications are within the scope of the invention.

What is claimed is:

1. A switched capacitor amplifier comprising:
    at least one first hold capacitor;
    at least one second hold capacitor;
    a transconductance amplifier;
    first switching means for either (a) allowing said at least one first hold capacitor to retain an input voltage,or (b) outputting a retained input voltage through said transconductance amplifier; and
    second switching means for either (a) feeding a voltage obtained by reversing polarity of voltage retained by said at least one second hold capacitor back to said transconductance amplifer to output an output voltage, or (b) allowing voltage retained by said at least one first hold capacitor to be held by said at least one second hold capacitor.

2. A switched capacitor amplifier comprising:
    at least one first hold capacitor;
    at least one second hold capacitor;
    a transconductance amplifier;
    first switching means for either (a) allowing said at least one first hold capacitor to retain an input voltage, or (b) outputting a retained input voltage through said transconductance amplifier; and
    second switching means for either (a) feeding a voltage obtained by reversing polarity of voltage retained by said at least one second hold capacitor back to said transconductance amplifier for output, or (b) allowing voltage retained by said at least one first hold capacitor to be held by said at least one second hold capacitor, wherein voltage across said at least one second hold capacitor is provided as an output voltage.

3. The amplifier of claim 1, wherein said first switching means comprises:
    a first group of analog switches for applying said input voltage to said at least one first hold capacitor; and
    a second group of analog switches that form a feedback loop via said at least one first hold capacitor in said transconductance amplifier.

4. The amplifier of claim 2, wherein said first switching means comprises.
    a first group of analog switches for applying said input voltage to said at least one first hold capacitor; and
    a second group of analog switches that form a feedback loop via said at least one first hold capacitor in said transconductance amplifier.

5. The amplifier of claim 1, wherein said second switching means comprises:
    a first group of analog switches that form a feedback loop via said at least one second hold capacitor in said transconductance amplifier; and
    a second group of analog switches for applying output of said transconductance amplifier to said at least one second hold capacitor.

6. The amplifier of claim 2, wherein said second switching means comprises:
    a first group of analog switches that form a feedback loop via said at least one second hold capacitor in said transconductance amplifier; and
    a second group of analog switches for applying output of said transconductance amplifer to said at least one second hold capacitor.

7. The amplifier of claim 1, wherein said input voltage and said output voltage are a differential voltage.

8. The amplifier of claim 2, wherein said input voltage and said output voltage are a differential voltage.

9. The amplifier of claim 7, wherein said at least one first hold capacitor comprises a first capacitor connected in series to a second capacitor, wherein a common mode reference voltage is applied to a connecting point between said first capacitor and said second capacitor and said differential voltage is applied to one end of said first and second capacitors.

10. The amplifier of claim 8, wherein said at least one first hold capacitor comprises a first capacitor connected in series to a second capacitor, wherein a common mode reference voltage is applied to a connecting point between said first capacitor and said second capacitor and said differential voltage is applied to one end of said first and second capacitors.

11. The amplifier of claim 7, wherein said at least one second hold capacitor comprises a first capacitor connected in series to a second capacitor, wherein voltage retained by said at least one first hold capacitor is allowed to be held by said at least one second hold capacitor, wherein a common mode reference voltage is applied to a connecting point between said first and second capacitors, and wherein said retained voltage is applied to one end of each of said first and second capacitors.

12. The amplifier of claim 8, wherein said at least one second hold capacitor comprises a first capacitor connected in series to a second capacitor, wherein voltage retained by said at least one first hold capacitor is allowed to be held by said at least one second hold capacitor, wherein a common mode reference voltage is applied to a connecting point between said first and second capacitors, and wherein said retained voltage is applied to one end of each of said first and second capacitors.

13. A switched capacitor amplifier comprising:
   at least one first hold capacitor;
   at least one second hold capacitor;
   at least one third hold capacitor;
   a transconductance amplifier;
   first switching means for either (a) allowing said first hold capacitor to retain an input voltage, or (b) outputting a retained input voltage through said transconductance amplifier; and
   second switching means for either (a) transferring an electric charge in said at least one third hold capacitor to said at least one second hold capacitor and feeding a voltage obtained by reversing polarity of voltage retained by said at least one second hold capacitor back to said transconductance amplifier for outputting as an output voltage, or (b) allowing voltage retained by said at least one first hold capacitor to be held by said at least one second hold capacitor and said third hold capacitor.

14. A switched capacitor amplifier comprising:
   at least one first hold capacitor;
   at least one second hold capacitor;
   at least one third hold capacitor;
   a transconductance amplifier;
   first switching means for either (a) allowing said at least one hold capacitor to retain an input voltage, or (b) outputting a retained input voltage through said transconductance amplifier; and
   second switching means for either (a) transferring an electric charge in said at least one third hold capacitor to said at least one second hold capacitor and feeding a voltage obtained by reversing polarity of voltage retained by said at least one second hold capacitor back to said transconductance amplifier, or (b) allowing voltage retained by said at least one first hold capacitor to be held by said at least one second hold capacitor and said at least one third hold capacitor, wherein voltage across said at least one second hold capacitor is provided as an output voltage.

15. The amplifier of claim 13, wherein said first switching means comprises:
   a first group of analog switches for applying input voltage to said at least one first hold capacitor; and
   a second group of analog switches that form a feedback loop via said at least one first hold capacitor in said transconductance amplifier.

16. The amplifier of claim 14, wherein said first switching means comprises:
   a first group of analog switches for applying input voltage to said at least one first hold capacitor; and
   a second group of analog switches that form a feedback loop via said at least one first hold capacitor in said transconductance amplifier.

17. The amplifier of claim 13, wherein said second switching means comprises:
   a first group of analog switches that form a loop for transferring an electric charge in said at least one third hold capacitor to said at least one second hold capacitor and form a feedback loop via said at least one second hold capacitor in said transconductance amplifier; and
   a second group of analog switches for applying output voltage from said transconductance amplifier to said at least one second hold capacitor and said at least one third hold capacitor.

18. The amplifier of claim 14, wherein said second switching means comprises:
   a first group of analog switches that form a loop for transferring an electric charge in said at least one third hold capacitor to said at least one second hold capacitor and form a feedback loop via said at least one second hold capacitor in said transconductance amplifier; and
   a second group of analog switches for applying output voltage from said transconductance amplifier to said at least one second hold capacitor and said at least one third hold capacitor.

19. The amplifier of claim 13, wherein said input voltage and said output voltage are a differential voltage.

20. The amplifier of claim 14, wherein said input voltage and said output voltage are a differential voltage.

21. The amplifier of claim 19, wherein said at least one first hold capacitor comprises a first capacitor connected in series with a second capacitor, wherein a differential voltage is retained and a common mode reference voltage is applied to a connecting point between said first and second capacitors, and wherein a differential voltage is applied to one end of each of said first and second capacitors.

22. The amplifier of claim 20, wherein said at least one first hold capacitor comprises a first capacitor connected in series with a second capacitor, wherein a differential voltage is retained and a common mode reference voltage is applied to a connecting point between said first and second capacitors, and wherein a differential voltage is applied to one end of each of said first and second capacitors.

23. The amplifier of claim 19, wherein said at least one second hold capacitor comprises a first capacitor connected in series with a second capacitor, and said at least one third hold capacitor comprises a third capacitor connected in series with a fourth capacitor, wherein voltage retained by said at least one first hold capacitor is allowed to be held by said at least one second hold capacitor and said at least one third hold capacitor, and a common mode reference voltage is applied to a connecting point between said first and second capacitors and to a connecting point between said third and fourth capacitors, and wherein retained voltage is applied to one end of each of said first, second, third and fourth capacitors.

24. The amplifier of claim 20, wherein said at least one second hold capacitor comprises a first capacitor connected in series with a second capacitor, and said at least one third hold capacitor comprises a third capacitor connected in series with a fourth capacitor, wherein voltage retained by said at least one first hold capacitor is allowed to be held by said at least one second hold capacitor and said at least one third hold capacitor, and a common mode reference voltage is applied to a connecting point between said first and second capacitors and to a connecting point between said third and fourth capacitors, and wherein retained voltage is applied to one end of each of said first, second, third and fourth capacitors.

25. The amplifier of claim 14, further comprising a sample and hold circuit, a subtractor, and a residue amplifier disposed in a one bit pipeline stage circuit comprising a high speed pipeline A/D converter.

* * * * *